(12) United States Patent
Xu et al.

(10) Patent No.: US 11,432,423 B2
(45) Date of Patent: Aug. 30, 2022

(54) TOOLLESS CARD LOCK MECHANISM

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Guang-Lei Xu, Kunshan (CN); Zhuang-Xing Li, Kunshan (CN); Zhi-Bin Zhao, Kunshan (CN); Wen-Jun Tang, Kunshan (CN)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 2 days.

(21) Appl. No.: 17/106,200

(22) Filed: Nov. 30, 2020

(65) Prior Publication Data
US 2021/0168959 A1 Jun. 3, 2021

(30) Foreign Application Priority Data
Nov. 28, 2019 (CN) .......................... 201911191901.2

(51) Int. Cl.
*H05K 7/00* (2006.01)
*G06F 1/18* (2006.01)
*H05K 7/12* (2006.01)

(52) U.S. Cl.
CPC ............... *H05K 7/12* (2013.01); *G06F 1/183* (2013.01)

(58) Field of Classification Search
CPC ........ H05K 7/12; H05K 7/1417; G06F 1/183; G06F 1/185; H01R 13/639; H01R 12/721; H01R 12/73; H01R 13/648
See application file for complete search history.

(56) References Cited

U.S. PATENT DOCUMENTS

| | | | |
|---|---|---|---|
| 7,182,618 B1 * | 2/2007 | Choy .................... | H05K 7/1404 439/607.05 |
| 8,657,619 B2 * | 2/2014 | Lin .......................... | G06F 1/185 439/328 |
| 9,703,331 B1 * | 7/2017 | Chien ..................... | G06F 1/185 |

(Continued)

FOREIGN PATENT DOCUMENTS

TW M576624 U 4/2019

*Primary Examiner* — Rockshana D Chowdhury
(74) *Attorney, Agent, or Firm* — Ming Chieh Chang; Wei Te Chung

(57) ABSTRACT

A securing mechanism for retaining a daughter board upon the primary board includes a base, which is moveably assembled upon the main board, and a latch assembled upon the base and moveable between a locking position and an unlocking position. The base forms a support platform upwardly abutting against the underside of the daughter board and equipped with an arc protrusion for receipt within a notch of the daughter board, and a grounding piece with one end mechanically and electrically connecting a grounding pad of the daughter board and the other end mechanically and electrically connecting a grounding pad on the main board. The base forms a horizontal slot to receive the main body so as to retain the base to the main body in position in the vertical direction. The latch forms a pressing face downwardly pressing an upper side of the daughter board.

17 Claims, 14 Drawing Sheets

(56) References Cited

U.S. PATENT DOCUMENTS

| | | | |
|---|---|---|---|
| 10,331,181 B2* | 6/2019 | Ng | G06F 1/185 |
| 10,416,728 B2* | 9/2019 | Della Fiora | H01R 12/7058 |
| 10,608,355 B2* | 3/2020 | Chen | H01R 12/73 |
| 10,840,619 B1* | 11/2020 | Wang | H05K 7/1418 |
| 11,132,034 B2* | 9/2021 | Nguyen | H05K 7/1417 |
| 2020/0244008 A1* | 7/2020 | Wu | F16B 21/02 |
| 2021/0064102 A1* | 3/2021 | Tseng | H05K 7/142 |

* cited by examiner

TOOLLESS CARD LOCK MECHANISM

1. FIELD OF THE DISCLOSURE

The invention is related to a card edge connector assembly, and particularly to a toolless card locking mechanism mounted upon a printed circuit board for holding a daughter card(board)/memory module in position.

2. DESCRIPTION OF RELATED ARTS

U.S. Pat. No. 7,959,461 discloses the electrical connector assembly related to Mini PCI (mini peripheral component interconnect), wherein the daughter card/memory module is assembled upon the electrical connector assembly via rotation with the front end received within the slot of the electrical connector and the rear end assembled to the printed circuit board via the screws. U.S. Patent Application 20150050828 discloses a SODIMM (Small Outlie Dual Inline Memory Module) connector assembly mounted upon the printed circuit board wherein the memory module is assembled upon the electrical connector assembly via rotation with the front end received within the slot of the electrical connector and the rear end assembled to the printed circuit board via a rotation device. Taiwan Utility Patent No. TWM576642U discloses a spacer removably assembled upon a primary printed circuit board with the resilient latch to hold a secondary printed circuit board in a parallel relation.

It is desired to provide the primary printed circuit board with a removable securing device which may efficiently retain the daughter board to the primary board in a parallel relation.

SUMMARY OF THE DISCLOSURE

To achieve the objectives, a securing mechanism for retaining a daughter board upon the primary board includes a base, which is moveably assembled upon the main board in a horizontal direction, and a latch assembled upon the base and moveable between a locking position and an unlocking position. The base forms a support platform upwardly abutting against the underside of the daughter board and equipped with an arc protrusion for receipt within a notch of the daughter board, and a grounding piece with one end mechanically and electrically connecting a grounding pad of the daughter board and the other end mechanically and electrically connecting a grounding pad on the main board. The base forms a horizontal slot to receive the main body so as to retain the base to the main body in position in the vertical direction. The latch forms a pressing face downwardly pressing an upper side of the daughter board.

DETAILED DESCRIPTION OF THE PREFERRED EMBODIMENT

Figure 1:
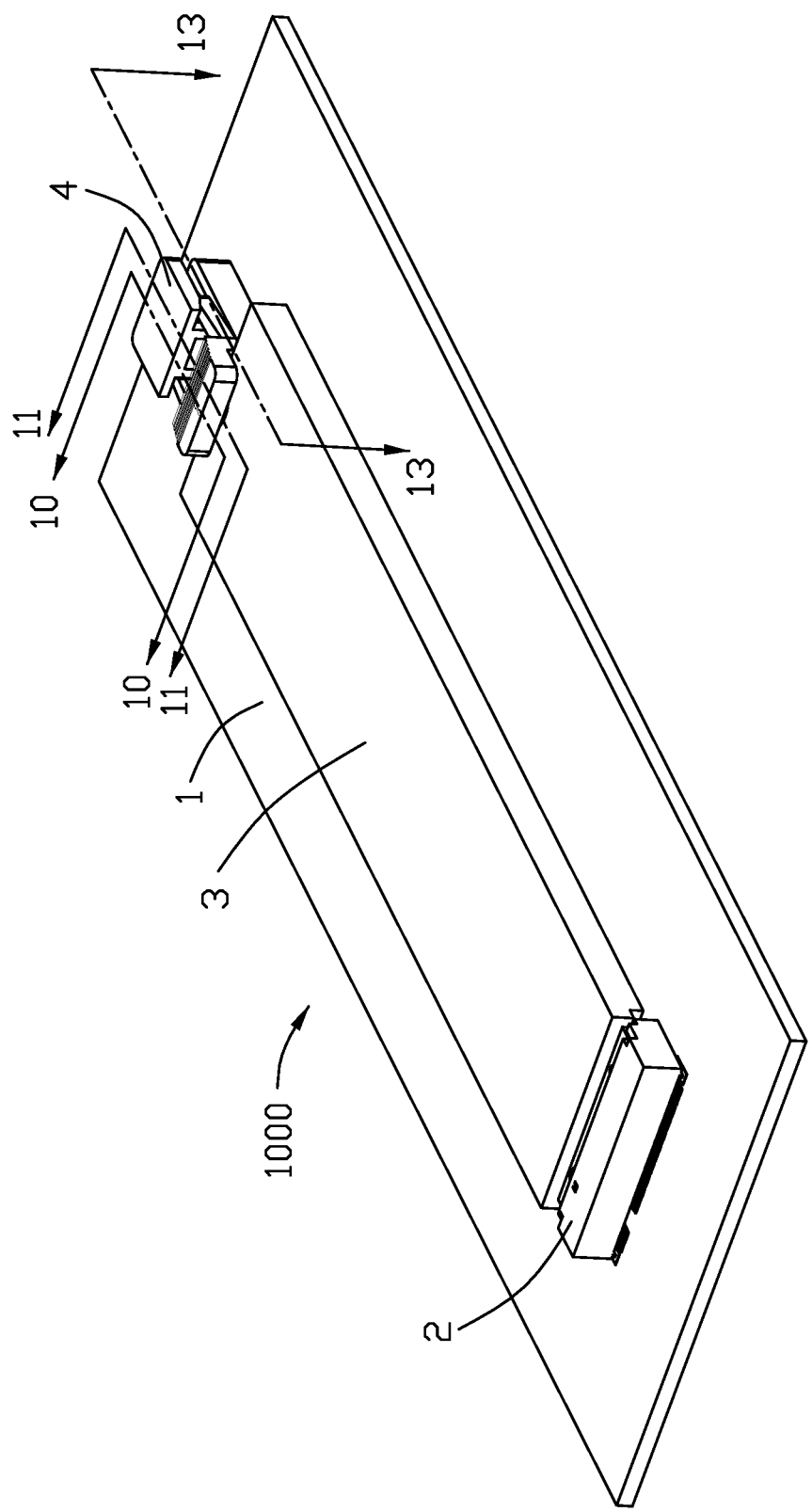
FIG. 1 is a perspective view of an electrical connector assembly including the securing mechanism used with an electrical connector mounted upon the PCB for retaining a daughter board according to the invention.
Figure 2:
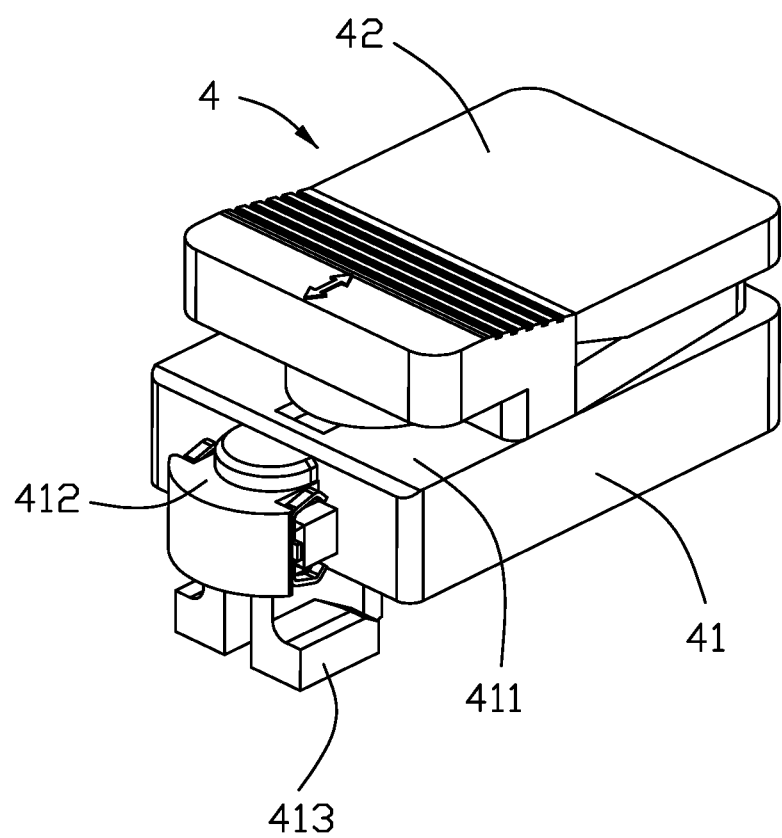
FIG. 2 is a perspective view of the securing mechanism of FIG. 1.
Figure 3:
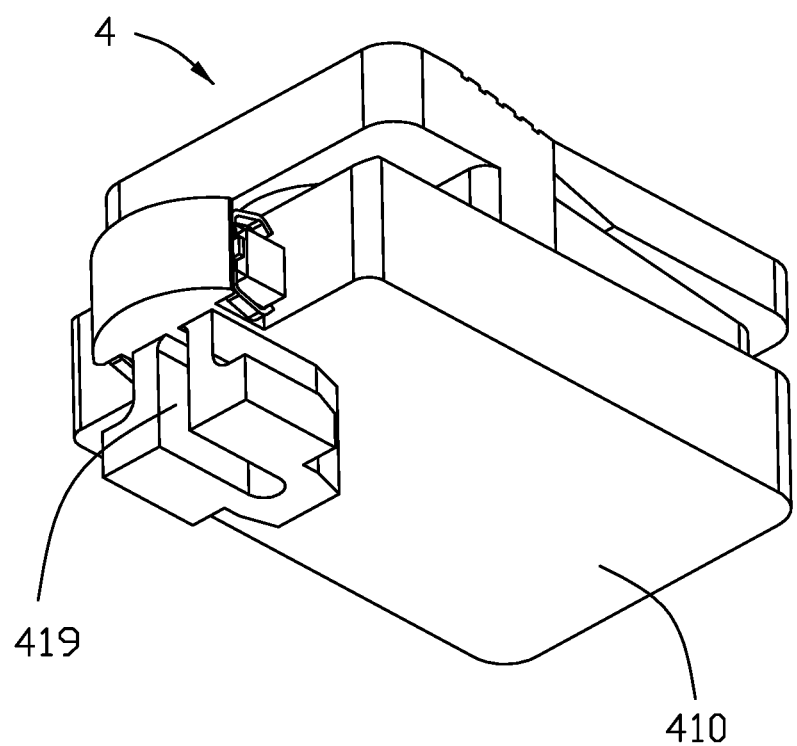
FIG. 3 is another perspective view of the securing mechanism of FIG. 2.
Figure 4:
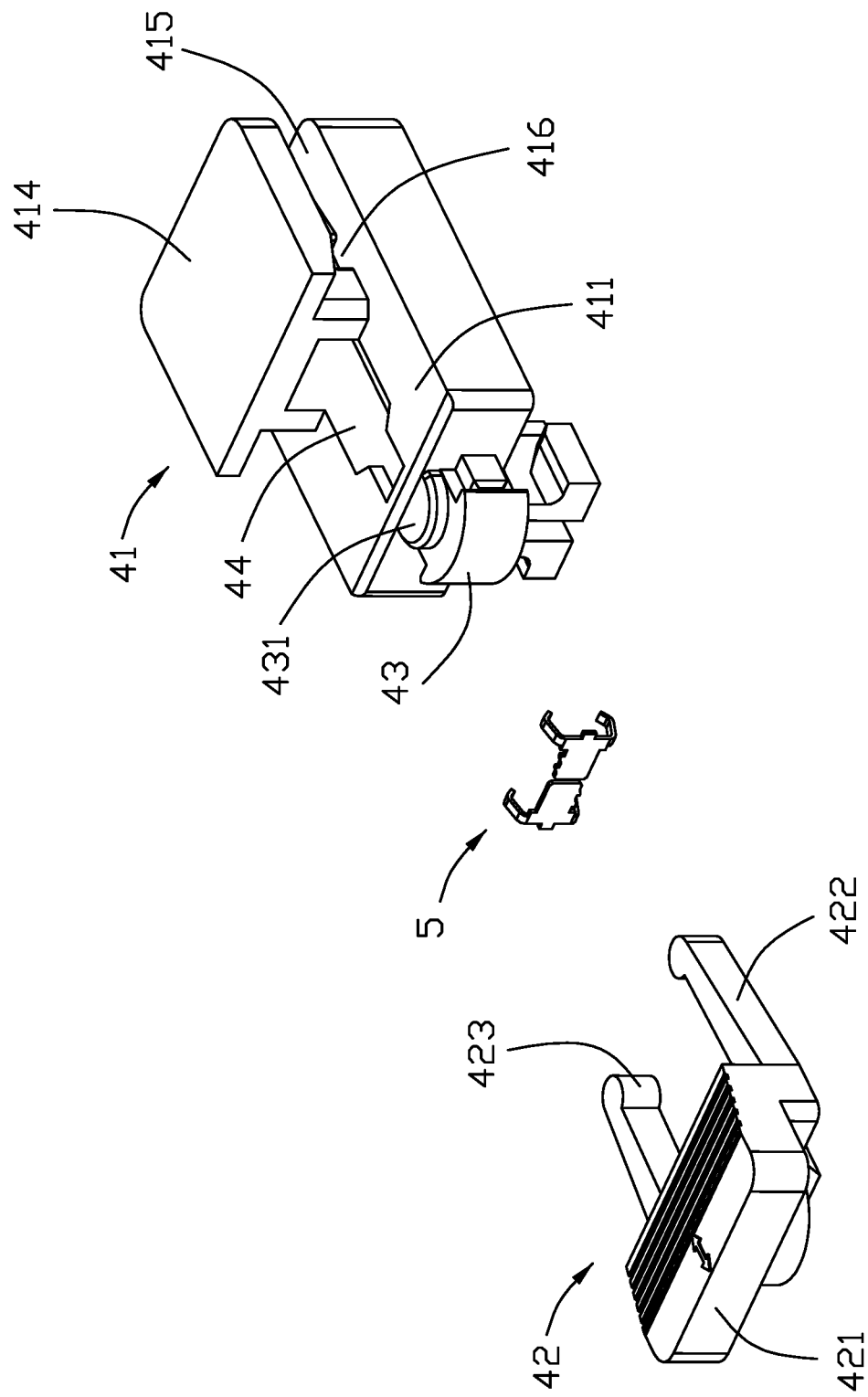
FIG. 4 is an exploded perspective view of the securing mechanism of FIG. 3.
Figure 5:
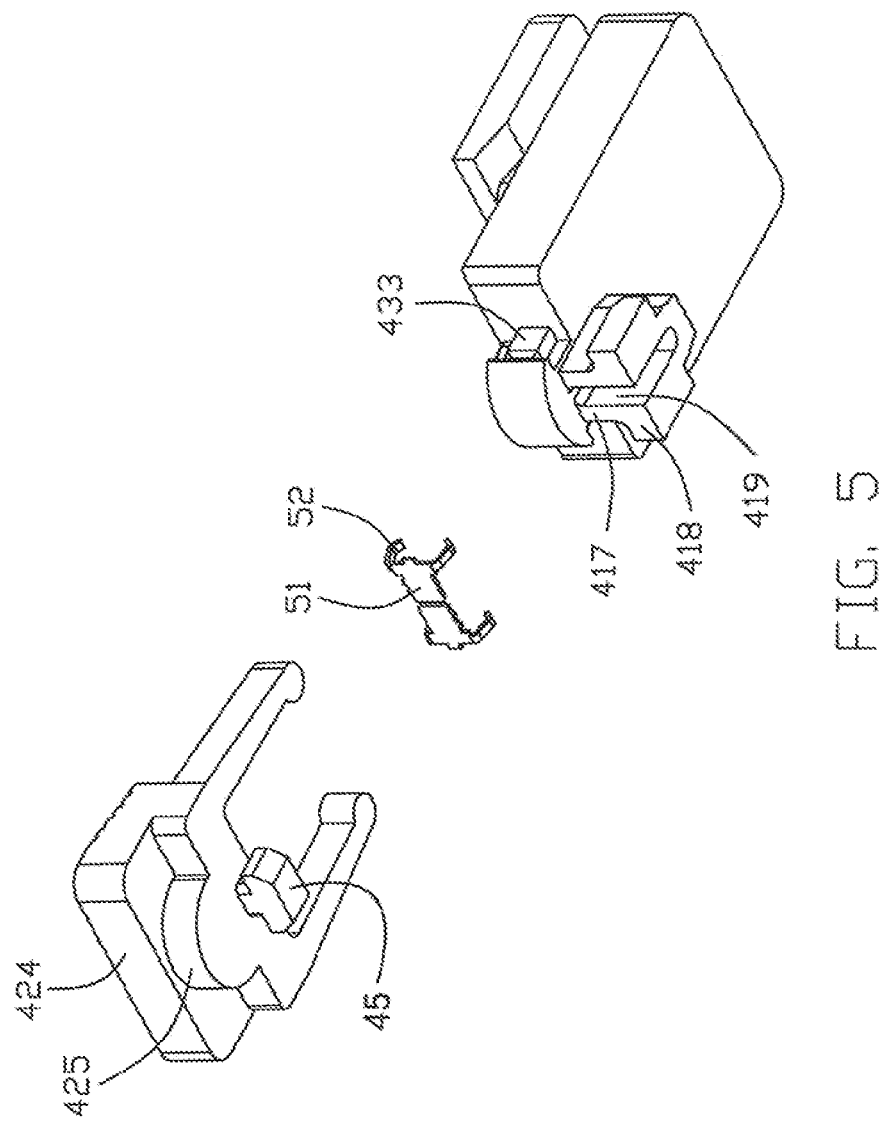
FIG. 5 is another exploded perspective view of the securing mechanism of FIG. 4.
Figure 6:
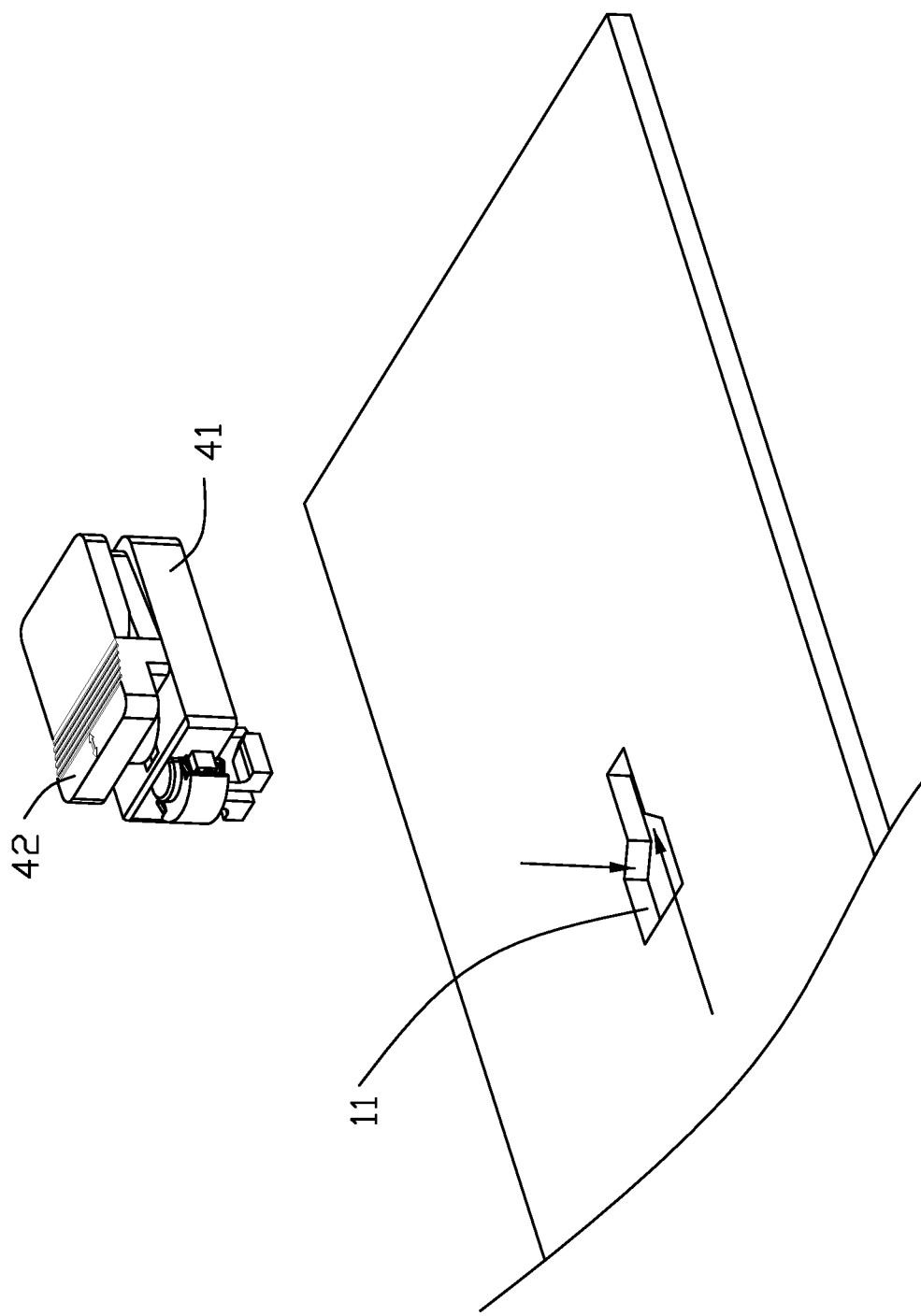
FIG. 6 is an exploded perspective view of the electrical connector assembly of FIG. 1 without showing the electrical connector and the daughter board wherein the securing mechanism is removed away from the main board.
Figure 7:
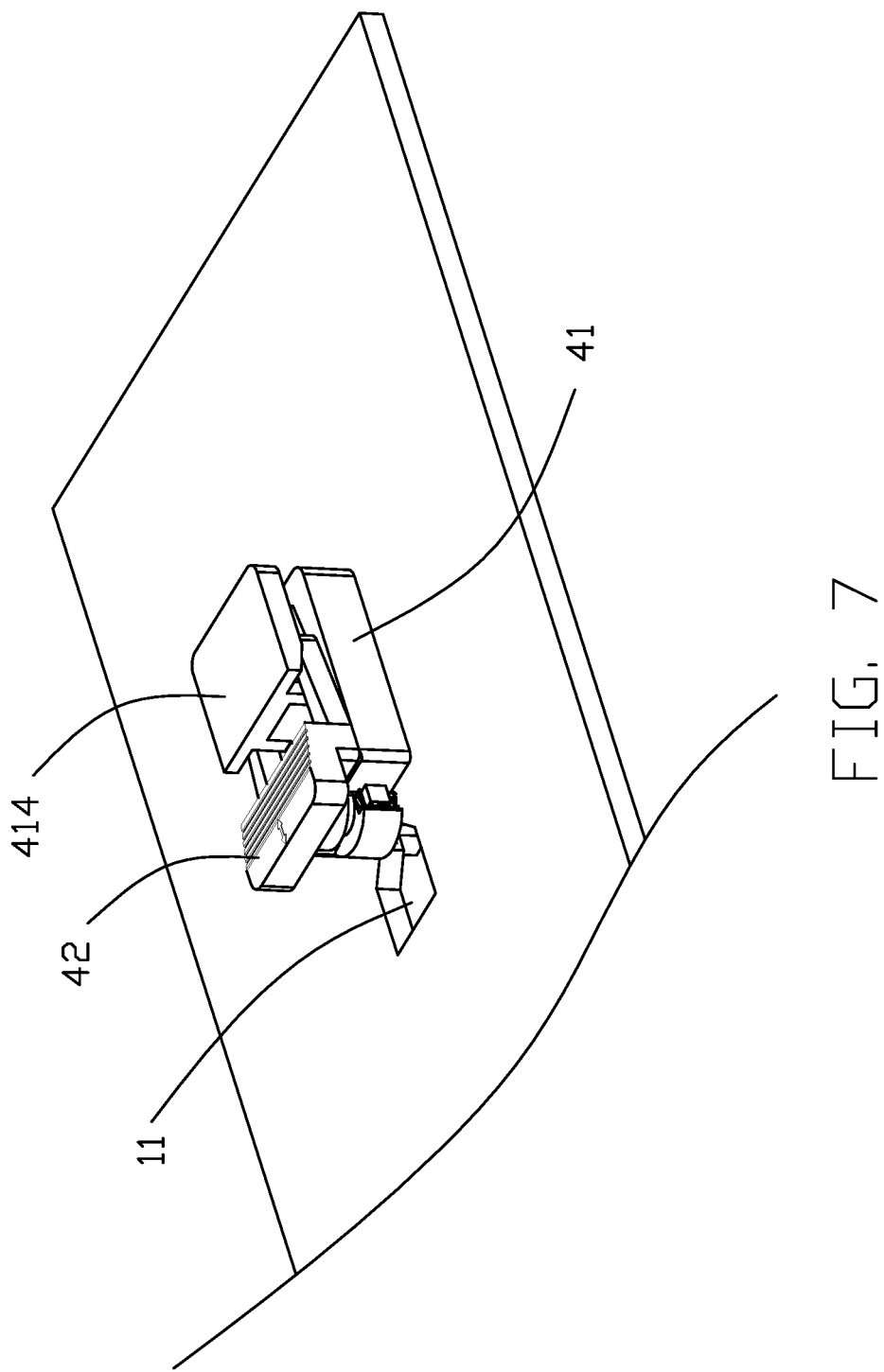
FIG. 7 is a perspective view of the electrical connector assembly of FIG. 6 wherein the securing mechanism is assembled upon the main board and the latch is located in the locking position with regard to the base.
Figure 8:
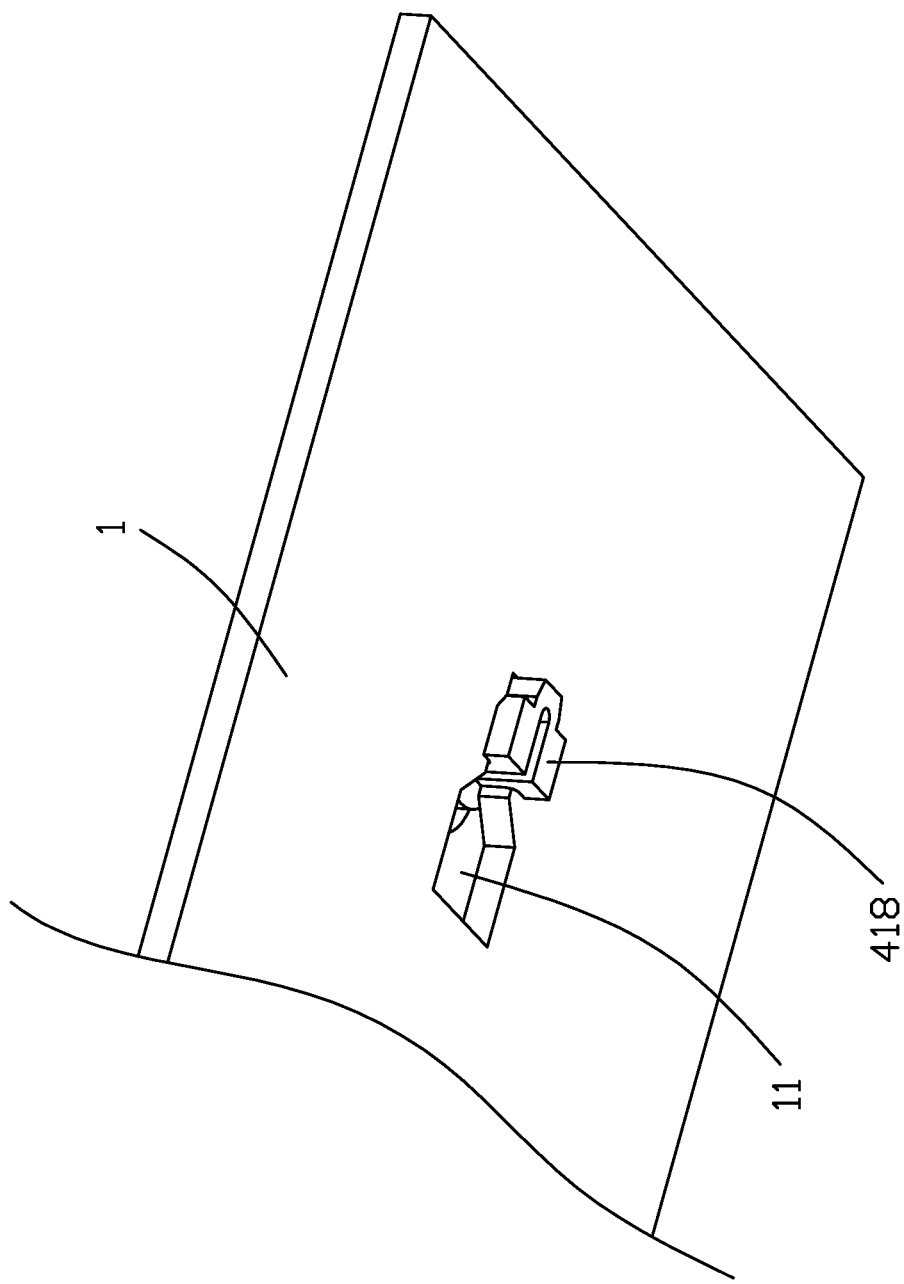
FIG. 8 is another perspective view of the electrical connector assembly of FIG. 7.
Figure 9:
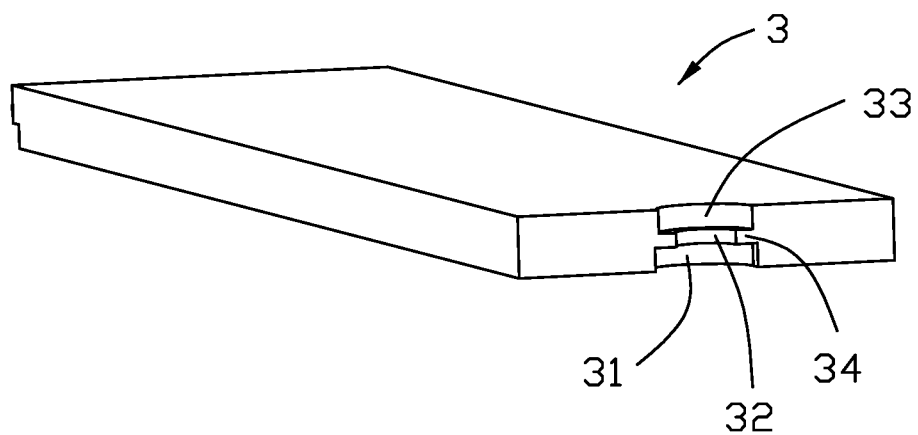
FIG. 9 is a perspective view of the daughter board of the electrical connector assembly of FIG. 1.
Figure 10:
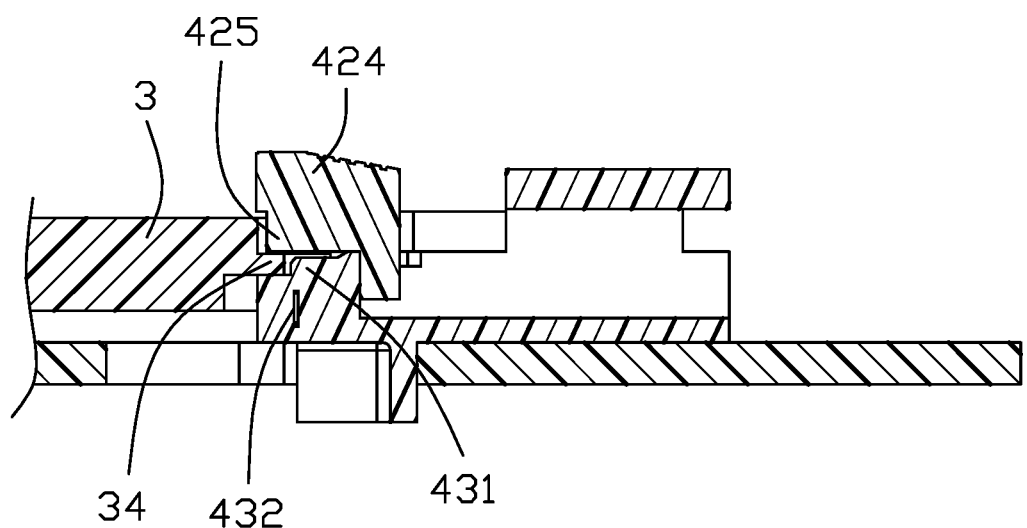
FIG. 10 is a cross-sectional view of the electrical connector assembly of FIG. 7 with the daughter board retained by the latch of the securing mechanism.

Referring to FIGS. 1-14, an electrical connector assembly 1000 includes a main (printed circuit) board 1, a card edge connector 2 mounted upon the main body 1, and a securing mechanism 4 for retaining a daughter board 3 to the main board 1. The daughter board 3 forms a first notch 31, a second notch 32 and a third notch 33 aligned with one another in a vertical direction at the rear end wherein the second notch is smaller than both the first notch 31 and the third notch 33 and is formed in an engagement board 34 of the daughter board 3.

The main board 1 forms an opening 11 with a large part and a small part communicating with each other in a front-to-back direction. The securing mechanism is assembled within the opening 11, and includes a base 41, a latch 42 assembled upon the base 41 and moveable relative to the base 41 in the front-to-back direction. The base 11 includes a downward mounting face 410 for sitting upon an upper face of the main board 1, and an upward abutting/sliding face 411 for supporting the latch 42, and an upward support face 412 for supporting the daughter board 3. The base 41 includes a mounting section 413 below the mounting face 413, and a tower 414 above the abutting face 411. A slot (not labeled) is formed between the mounting face 410 and the mounting section 413 for receive the daughter board 3 therein when the mounting section 413 is received within the opening 11. A sliding groove 415 is formed between the abutting face 411 and the tower 414. The latch 42 includes a pressing section 421 and a pair of spring arms 422 slidable in the sliding groove 415 between the locking position and the unlocking position.

Figure 11:
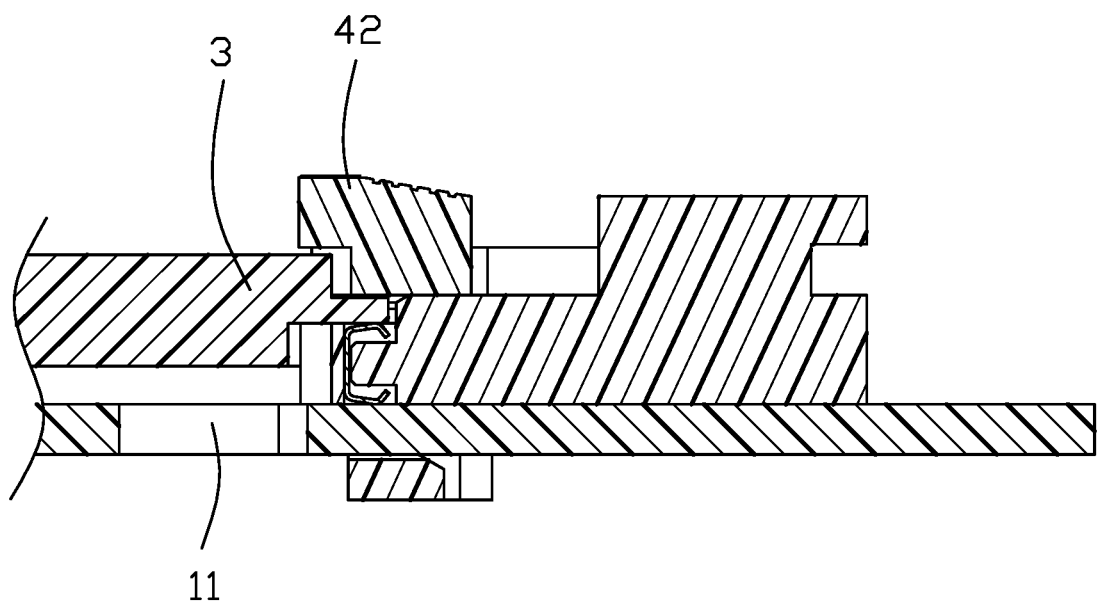
FIG. 11 is another cross-sectional view of the electrical connector assembly of FIG. 10.
Figure 12:
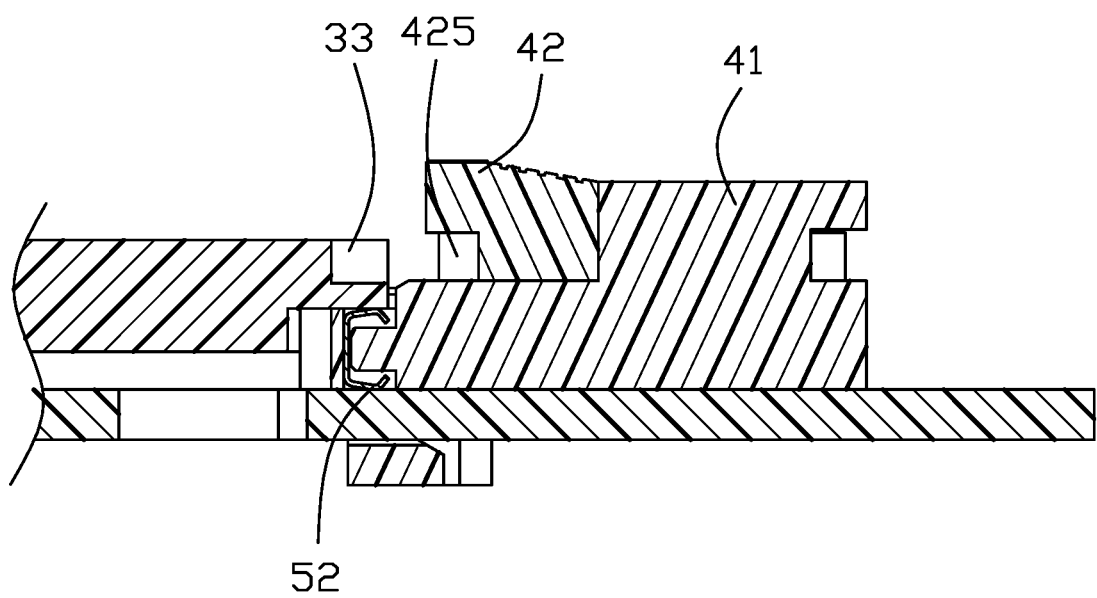
FIG. 12 is a cross-sectional view of the electrical connector assembly of FIG. 11 with the daughter board unlatched from the latch of the securing mechanism.
Figure 13:
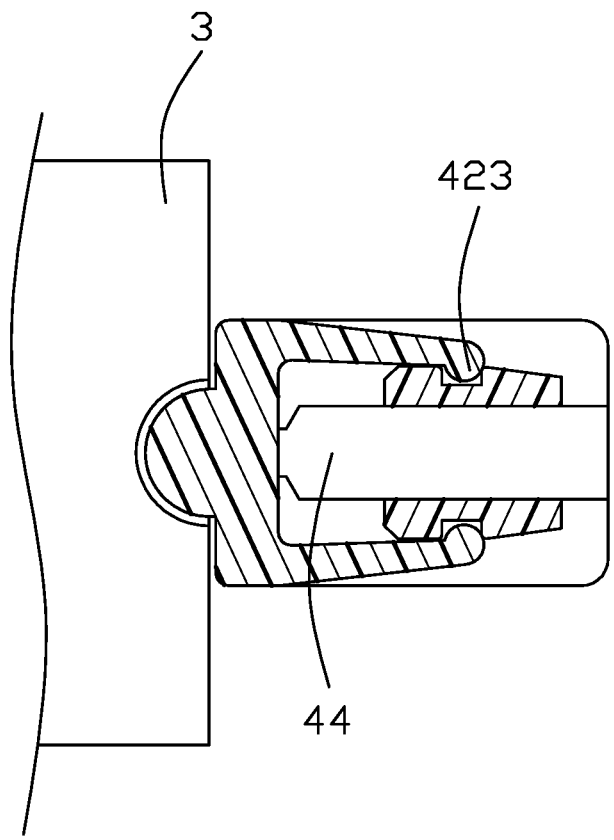
FIG. 13 is a cross-sectional view of the electrical connector assembly of FIG. 10.
Figure 14:
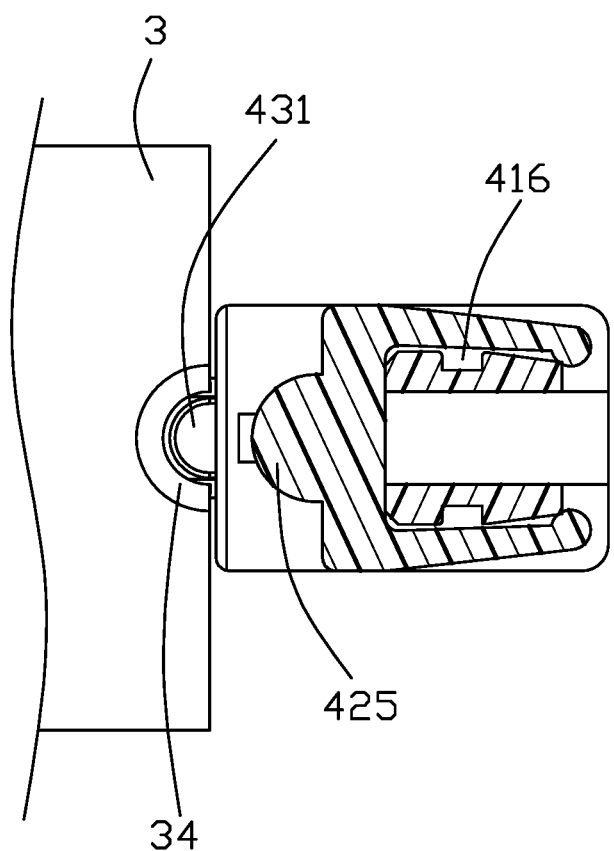
FIG. 14 is a cross-sectional view of the electrical connector assembly of FIG. 12.

Each spring arm 422 includes an inward protrusion 423. The tower 414 forms a locking recess 416 to receive the protrusion 423 of the spring arm 422 when the latch 42 is located in the locking position. Oppositely, when the latch 42 is located in the unlocking position, the protrusion 423 is released from the locking recess 416 and located at the exterior side. The pressing section 421 includes an upper operation section 424 and a lower abutting section 425 wherein the pressing section 421 extend forward beyond the abutting section 425. As shown in FIG. 12, when the latch 42 is located at the unlocking position, the daughter board 3 is free to upwardly move away from the securing mechanism 4. Opposite, as shown in FIG. 11, when the latch 42 is located at the locking position, the abutting section 425 is received within the third notch 33 to downwardly press an upper side of the engagement board 34 of the daughter board 3 for preventing upward movement of the daughter board 3.

The base 41 forms a support platform 43 on which the support face 412 is formed. The support platform 43 is received within the first notch 31 to have the support face 412 upwardly abut against an underside of the engagement board 34 of the daughter board 3 for preventing downward movement of the daughter board 3 when the daughter board 3 is assembled to the securing mechanism 4. A restriction section 431 is formed on the support face 412 to be engaged within the second notch 32 of the daughter board 3 when the daughter board 3 is assembled to the securing mechanism 4 so as to restrict rearward movement of the daughter board 3.

The base 41 forms an opening or hole 44 through the abutting face 411 with a large part/section and a small part/section thereof. The latch 42 forms an upside-down T-shaped hook structure 45 so as to have the hook structure 45 downwardly assembled into the large part of the opening 44 and moved along the small part of the opening 44 for not being withdrawn from the base 41.

The mounting section 413 forms another upside-down T-shaped hook structure to include a vertical section 417 and a pair of wings 418. The vertical section 417 forms a groove 419 to provide resiliency thereof. The mounting section 413 is initially downwardly assembled into the large part of the opening 11 in the vertical direction and successive moved into the small part of the opening 11 so as to have the vertical section 417 received within the opening 11 and the wings 418 upwardly abut against the underside of the main board 1. Via this interengagement structure, the base 41 can be releasable assembled to the main board 1 without using the tool. Moreover, only one securing mechanism is needed on the main board to comply with differently sized daughter boards as long as differently positioned openings 11 are formed on the main board 1.

In this embodiment, the base 41 is further equipped with a pair of grounding pieces 5 respectively located on two opposite sides of the supporting platform 43. Each grounding piece 5 includes a retention section 51 retained into a retention groove 432 in the support platform 43, and a pair of spring arms 52 respectively located by two sides of the partition 433 wherein the upper spring arm 52 contacts the grounding pad formed on an underside of the daughter board 3, while the lower spring arm 52 contacts the grounding pad formed on an upper side of the main board 1 when the securing mechanism 4 is retained to the main board 1 and the daughter board 3 is retained by the securing mechanism 4.

While a preferred embodiment in accordance with the present disclosure has been shown and described, equivalent modifications and changes known to persons skilled in the art according to the spirit of the present disclosure are considered within the scope of the present disclosure as described in the appended claims.

What is claimed is:

1. An electrical assembly comprising: a main printed circuit board;
    an opening formed in the main printed circuit board; a securing mechanism removably attached upon the main printed circuit board and including: a base having a mounting section assembled through the opening and retained to the main printed circuit board;
    and a latch removably assembled upon the base and manually movable relative to the base between a locking position and an unlocking position in a front-to-back direction;
    wherein the latch provides an abutting section extending forwardly at the locking position to downwardly press a daughter board positioned above the main printed circuit board in parallel, and the base forms a support face adapted to upwardly support the daughter board.

2. The electrical assembly as claimed in claim 1, wherein said base forms an arc restriction section adapted to be received within a notch of the daughter board.

3. The electrical assembly as claimed in claim 1, wherein the mounting section abuts against an underside of the main printed circuit board for preventing the base from being withdrawn from the main printed circuit board.

4. The electrical assembly as claimed in claim 1, wherein the opening includes a large part and a small part thereof, and the base is assembled into the opening from the large part to the small part.

5. The electrical assembly as claimed in claim 1, wherein in the securing mechanism, one of the base and the latch forms a hole and the other thereof forms a hook structure extending through the hole.

6. The electrical assembly as claimed in claim 5, wherein the hole forms a large section and a small section, and the hook structure extends initially through the large section and successively moves into the small section.

7. The electrical assembly as claimed in claim 6, wherein the base forms the hole and the latch forms the hook structure.

8. The electrical assembly as claimed in claim 1, wherein the base is equipped with a one-piece metallic grounding piece unitarily formed with an upper arm adapted to be connected to a grounding pad of the daughter board and a lower arm adapted to be connected to a grounding pad of the main printed circuit board, the upper arm having an upward-facing contacting surface.

9. A securing mechanism for use with a daughter board defining a notch in a rear edge, and a printed circuit board having a through opening, comprising:
    a base defining a downward mounting face adapted to sit upon the printed circuit board and an upward abutting face opposite to the mounting face in a vertical direction; and
    a latch removably assembled upon the base and manually moveable relative to the base between a locking position and an unlocking position in a front-to-back direction perpendicular to the vertical direction; wherein
    the latch forms an abutting section extending forwardly at the locking position to downwardly press the daughter board while the base forms an upward support face adapted to upwardly support the daughter board.

10. The securing mechanism as claimed in claim 9, wherein the base forms a mounting section below the mounting face to extend through the opening and cooperating with the mounting face for sandwiching the printed circuit board therebetween in the vertical direction.

11. The securing mechanism as claimed in claim 10, wherein the opening includes a large part and a small part, and the mounting section initially extends into the large part and successively moves in the small part when the base is assembled to the printed circuit board.

12. The securing mechanism as claimed in claim 9, wherein one of the base and the latch forms an arc restriction section adapted to be received within the notch of the daughter board.

13. The securing mechanism as claimed in claim 12, wherein the arc restriction section is formed on the base.

14. The securing mechanism as claimed in claim 9, wherein the base is further equipped with a one-piece metallic grounding piece unitarily formed with an upper arm adapted to connect to a grounding pad of the daughter board and a lower arm adapted to connect to a grounding pad of the printed circuit board, the upper arm having an upward-facing contacting surface.

15. The securing mechanism as claimed in claim 9, wherein the base forms a tower above the abutting face to cooperate with the abutting face for forming a sliding groove in which the latch is moved.

16. A method of assembling a securing mechanism upon a printed circuit board and retaining a daughter board having a notch at a rear end thereof and arranged in a parallel relation with the printed circuit board, comprising steps of:

providing an opening in the printed circuit board;

providing a base with a mounting section and retaining the mounting section to the opening;

assembling a latch upon the base wherein the latch is moveable relative to the base between a locking position and an unlocking position in a front-to-back direction, wherein the latch has an abutting section and the base forms an upward support face adapted to upwardly support the daughter board when assembled; and placing the rear end of the daughter board upon the upward support face of the base and manually moving the latch from the unlocking position to the locking position to extend forwardly the abutting section to downwardly press the daughter board.

17. The method as claimed in claim 16, further including a step of assembling the daughter board upon the securing mechanism via rotation when the latch is in the unlocking position.

* * * * *